(12) United States Patent
Ozimek et al.

(10) Patent No.: US 8,786,263 B2
(45) Date of Patent: Jul. 22, 2014

(54) REDUCING STORED ELECTRICAL ENERGY IN A LEAD INDUCTANCE

(75) Inventors: Pawel Ozimek, Warsaw (PL); Rafal Bugyi, Warsaw (PL); Robert Dziuba, Columbus, IN (US); Andrzej Klimczak, Warsaw (PL); Marcin Zelechowski, Warsaw (PL)

(73) Assignee: TRUMPF Huettinger Sp. z o. o., Zielonka (PL)

( * ) Notice: Subject to any disclaimer, the term of this patent is extended or adjusted under 35 U.S.C. 154(b) by 806 days.

(21) Appl. No.: 12/617,181

(22) Filed: Nov. 12, 2009

(65) Prior Publication Data

US 2010/0213903 A1 Aug. 26, 2010

Related U.S. Application Data

(63) Continuation of application No. PCT/EP2008/003780, filed on May 9, 2008.

(30) Foreign Application Priority Data

May 12, 2007 (EP) .................................... 07009567

(51) Int. Cl.
| | | |
|---|---|---|
| G05F 1/00 | (2006.01) | |
| H01J 37/32 | (2006.01) | |
| H01M 10/44 | (2006.01) | |
| H01M 10/42 | (2006.01) | |
| H05H 1/36 | (2006.01) | |

(52) U.S. Cl.
CPC ......... *H01M 10/42* (2013.01); *H01J 37/32174* (2013.01); *H01J 37/32091* (2013.01); *H01M 10/44* (2013.01); *H01M 10/425* (2013.01); *H01M 10/4264* (2013.01); *Y02E 60/12* (2013.01); *H05H 1/36* (2013.01)
USPC ......................................... 323/266

(58) Field of Classification Search
USPC ......... 323/266, 273, 282, 234, 237, 274, 275, 323/276, 284, 285; 361/2
See application file for complete search history.

(56) References Cited

U.S. PATENT DOCUMENTS

| | | |
|---|---|---|
| 3,867,669 A | 2/1975 | Krasik |
| 4,428,023 A | 1/1984 | Maier |

(Continued)

FOREIGN PATENT DOCUMENTS

| | | |
|---|---|---|
| DE | 3514690 | 10/1986 |
| DE | 3706153 | 9/1988 |

(Continued)

OTHER PUBLICATIONS

International Search Report and Written Opinion for corresponding PCT Application No. PCT/EP2008/003780, mailed Jul. 24, 2008, 11 pages.

(Continued)

*Primary Examiner* — Adolf Berhane
*Assistant Examiner* — Jeffrey Gblende
(74) *Attorney, Agent, or Firm* — Fish & Richardson P.C.

(57) ABSTRACT

According to a first aspect of the present invention, reducing electrical energy stored in a load or in one or more leads for connecting a power supply with the load is achieved by plasma process power circuitry including a switch in operative connection with at least one of the leads for enabling/interrupting power to the load; a first electrical nonlinear device; an energy storing device arranged in series with the first electrical nonlinear device; and a pre-charging circuit in operative connection with the energy storing device, the pre-charging circuit configured to charge the energy storing device to a pre-determined energy level while power to the load is enabled.

7 Claims, 4 Drawing Sheets

(56) References Cited

U.S. PATENT DOCUMENTS

| | | | |
|---|---|---|---|
| 4,459,629 A | | 7/1984 | Titus |
| 5,192,894 A | * | 3/1993 | Teschner ................. 315/111.21 |
| 5,241,152 A | | 8/1993 | Anderson et al. |
| 5,303,139 A | | 4/1994 | Mark |
| 5,427,669 A | | 6/1995 | Drummond |
| 5,535,906 A | | 7/1996 | Drummond |
| 5,584,974 A | | 12/1996 | Sellers |
| 5,645,698 A | | 7/1997 | Okano |
| 5,651,865 A | | 7/1997 | Sellers |
| 5,682,067 A | | 10/1997 | Manley et al. |
| 5,718,813 A | | 2/1998 | Drummond et al. |
| 5,889,391 A | | 3/1999 | Coleman |
| 6,001,224 A | | 12/1999 | Drummond et al. |
| 6,024,844 A | | 2/2000 | Drummond et al. |
| 6,043,636 A | * | 3/2000 | Gaudreau et al. ............ 323/282 |
| 6,069,811 A | * | 5/2000 | Moriguchi et al. ........... 363/142 |
| 6,522,076 B2 | | 2/2003 | Goedicke et al. |
| 6,621,674 B1 | * | 9/2003 | Zahringer et al. .............. 361/58 |
| 6,876,205 B2 | | 4/2005 | Walde et al. |
| 6,943,317 B1 | | 9/2005 | Ilic et al. |
| 2004/0055881 A1 | * | 3/2004 | Christie ................. 204/298.08 |
| 2004/0182696 A1 | | 9/2004 | Kuriyama et al. |
| 2005/0040144 A1 | | 2/2005 | Sellers |
| 2008/0061794 A1 | * | 3/2008 | Pankratz ..................... 324/536 |

FOREIGN PATENT DOCUMENTS

| | | |
|---|---|---|
| DE | 4239218 | 5/1994 |
| EP | 0564789 | 10/1993 |
| EP | 1013792 | 6/2000 |
| JP | 08222398 | 8/1996 |
| JP | 2003268541 | 9/2003 |
| JP | 2004194420 | 7/2004 |
| JP | 2006237009 | 9/2006 |
| WO | 9749267 | 12/1997 |
| WO | 0113402 | 2/2001 |
| WO | 03056684 | 7/2003 |
| WO | 2008033968 | 3/2008 |

OTHER PUBLICATIONS

Notification Concerning Transmittal of International Preliminary Report on Patentability and Written Opinion from corresponding PCT Application No. PCT/EP2008/003780, mailed Nov. 26, 2009, 7 pages.

* cited by examiner

REDUCING STORED ELECTRICAL ENERGY IN A LEAD INDUCTANCE

CROSS REFERENCE OF RELATED APPLICATIONS

This application is a continuation of and claims priority under 35 U.S.C. §120 to PCT/EP2008/003780, filed on May 9, 2008, and designating the U.S., which claims priority under 35 U.S.C. §119 to European Patent Application No. 07 009 567.4, filed on May 12, 2007. The contents of both the prior applications are hereby incorporated by reference in their entirety.

TECHNICAL FIELD

The present invention relates to reducing electrical energy stored in a lead inductance or in a load coupled by the lead to a power supply, and, in particular, to accelerating extinction of plasma arcs in a plasma application.

BACKGROUND

Strong electrical current flowing from a power supply to a load, such as a plasma device or plasma chamber used in plasma applications, e.g., surface treatment or the like, through leads or cables of significant length is related to a significant amount of electrical energy, which is stored in the lead inductance. In the present context, a lead is meant to signify any electrical connection, such as a wire or the like, which can be associated with a non-negligible inductance value. When using a power supply apparatus for supplying power to a plasma process, plasma arc discharges or plasma arcs may occur inside the plasma chamber and may cause unwanted results. Typically, upon detection of an arc discharge in the plasma, power being supplied to the plasma application is interrupted. However, it is essential not only to decouple the power supply from the plasma as soon as possible, but also to decrease the amount of energy which is subsequently delivered to the arc discharge from the lead inductance.

One way to ensure this is by using relatively short leads or cables of low inductance, since the inductance value of a lead is generally proportional to the lead length. This approach, however, requires placing the power supply apparatus in close proximity to the plasma chamber which is difficult to accomplish in practice.

Thus, a need exists to ensure significant reduction of lead inductance energy delivered to a load without placing constraints on the relative locations of a power supply unit and the load, to which power is to be supplied.

SUMMARY

According to a first aspect of the present invention, reducing electrical energy stored in a load or in one or more leads for connecting a power supply with the load is achieved by plasma process power circuitry including a switch in operative connection with at least one of the leads for enabling/interrupting power to the load; a first electrical nonlinear device (such as, for example, an electrical valve); an energy storing device (such as, for example, a capacitance and/or an inductance) arranged in series with the first electrical nonlinear device; and a pre-charging circuit in operative connection with the energy storing device, the pre-charging circuit configured to charge the energy storing device to a pre-determined energy level while power to the load is enabled.

According to a second aspect, reducing electrical energy stored in a load or in one or more leads for connecting a power supply with the load is achieved by plasma process power circuitry including a first electrical nonlinear device (such as, for example, an electrical valve) connected with an energy storing device (such as, for example, a capacitance and/or an inductance), such that the first electrical nonlinear device and the energy storing device are configured to transfer energy from the leads or the load into the energy storing device and to prevent an energy transfer from the energy storing device into the leads or the load. In some implementations, the circuitry includes a switch in operative connection with at least one of the leads and configured to enable/interrupt power to the load. Further, some implementations include a pre-charging circuit in operative connection with the energy storing device and configured to charge the energy storing device to a pre-determined energy level while power to the load is enabled.

In addition, each of the implementations described above in the first and second aspects of the invention, may further include one or more of the following features and/or arrangements: a control/monitoring unit configured to interrupt power being supplied thru the leads prior to the energy transfer from the leads or the load into the energy storing device; the first electrical non-linear device may be configured to prevent a current originating from the pre-charging circuit and/or the energy storing device from being delivered into the leads; the pre-charging circuit may include a second electrical non-linear device connected between one of the leads and a node located between the energy storing device and the first electrical non-linear device; the first and/or the second electrical non-linear device may be a diode or a controlled MOSFET; the first and second electrical non-linear devices may be arranged with opposite blocking directions; the circuitry may further comprise discharge circuitry in operative connection with the energy storing device and configured to displace electrical energy stored in the energy storing device; the discharge circuitry may include a resistive element connected in parallel with the second electrical non-linear device, and a discharge switch connected with the energy storing device and configured to discharge the energy storing device through the resistive element; and/or the first electrical nonlinear device and the energy storing device may be arranged in a current path between two leads while power to the load is interrupted.

According to a third aspect, reducing electrical energy stored in a load or in one or more leads for connecting a power supply with the load is achieved by including any of the above implementations in a plasma process power supply having outputs for supplying power to a load via one or more leads.

According to a fourth aspect, reducing electrical energy stored in a load or in one or more leads connecting a power supply and the load is achieved by a power supply including power circuitry, the power circuitry including a first electrical nonlinear device and an energy storing device connected with the first electrical nonlinear device such that the first electrical nonlinear device and the energy storing device are configured to transfer energy from the leads or the load into the energy storing device and to prevent an energy transfer from the energy storing device into the leads or the load. In some implementations, the power supply is an alternating current power supply or a direct current power supply. Some implementations of the power supply may further include one or more of the following features and/or arrangements: a switch in operative connection with at least one of the leads, the switch configured to enable/interrupt power to the load; a control/monitoring unit configured to monitor an operational state of the plasma process and to control the switch in response to a result of said monitoring; and/or the power circuitry may be a first power circuitry, the power supply including a second power circuitry connected antiparallel to the first power circuitry.

According to a fifth aspect of the invention, reducing electrical energy stored in a load or in one or more leads for connecting a plasma process power supply with the load is achieved by disconnecting at least one of the leads from the power supply, transferring the electrical energy to an energy storing device, and inhibiting, with a non linear device, energy flow from the energy storing device into the leads by actively pre-charging the energy storing device prior to disconnecting the lead(s) from the power supply.

Further advantages and characteristics of the present invention can be gathered from the following description of preferred embodiments given by way of example only with reference to the enclosed drawings. Features mentioned above as well as below can be used in accordance with the present invention either individually or in conjunction. The following description is not to be regarded as an exhaustive enumeration but rather as examples with respect to a general concept underlying the present invention.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
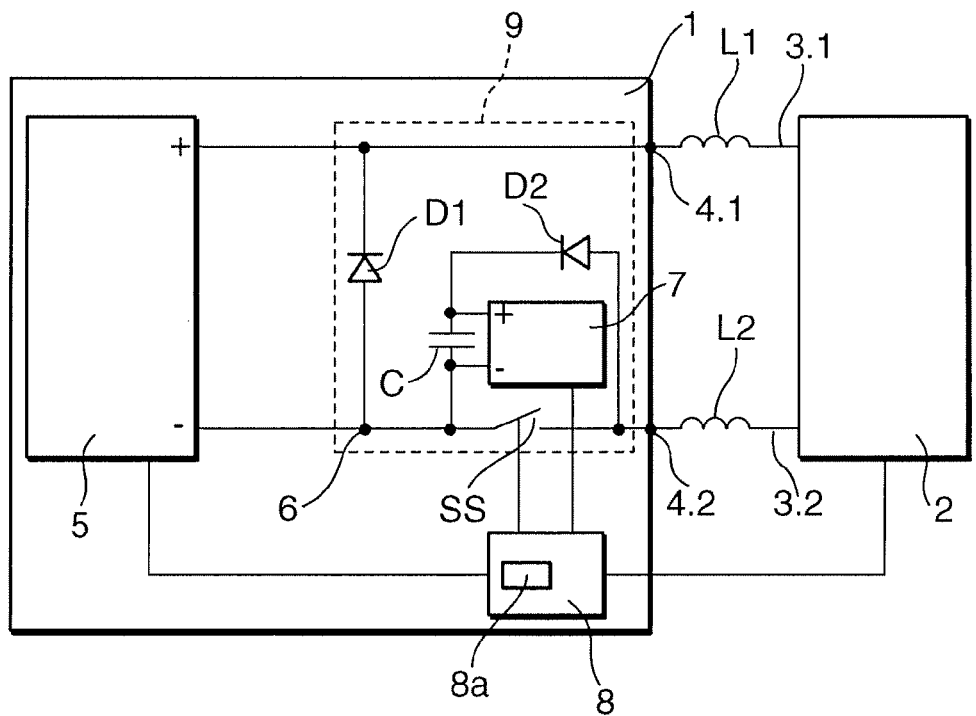
FIG. 1 is a circuit diagram of an embodiment of a power supply apparatus including a first embodiment of the circuit configuration.

The circuit configuration, power supply apparatus, and methods disclosed herein enable a significant reduction of the energy transferred from the lead inductance and/or the load to the arc discharge without relying on any shortening of leads or cables. In this way, improved arc extinction and plasma application is enabled without placing constraints on the relative location of power supply unit and load.

In accordance with a general idea underlying the present invention, a switch located between the power supply unit and the load, e.g., a plasma application, is closed during normal operating conditions, and an energy storing device, which may be connected in parallel with the switch, is pre-charged to a required energy (voltage) level by means of a pre-charging circuit. The latter can be devised as a voltage-controlled externally powered unit. When an arc is detected in the plasma, i.e., when a load condition requires interruption of the power being supplied together with a reduction of residual energy from the leads being delivered to the load, the switch is opened so that an output current from the lead inductances flows along a bypass path. The bypass path includes the energy storing device connected in series with an electrical non-linear device, e.g., a diode. This particular arrangement enables transferring a large amount of the residual energy stored in the lead inductance or the load into the energy storing device instead of delivering it to the load, e.g., to an arc discharge. The power supply must be interrupted at the same time the switch between the power supply and the load is opened so that no current from the power supply will flow. The only current, which is allowed to flow through the (parallel) electrical non-linear device is the inductive current from the cable inductance (i.e., not the current from the power supply).

As used herein, a non-linear device is a device where the current is not proportional to the voltage. A typical non-linear device is an electrical valve such as a diode. An electrical switch such as a transistor, thyristor, or triac, as well as a varistor or an electromechanical or magnetic device with non-linear behavior can also be considered as an electrical valve. An energy storing device may be any device which is able to store energy. Typical energy storing devices are capacitances, inductances, or arrangements containing both, at least one capacitance and at least one inductance.

The first electrical non-linear device may be arranged in parallel with the switch and the energy storing device may be arranged in parallel with the switch and in series with the first electrical non-linear device.

The pre-charged energy storing device (capacitor) ensures that the voltage applied to the load is reversed to a predefined value, mainly independent on the flowing current. This value can be easily matched with the voltage specification of the cooperating elements, thus keeping them safe and providing optimal current shut-off performance.

The term "interrupting the power supply" means that no voltage is present at the output of the power supply for the time of interruption. This can be achieved by opening a serial switch or shortening the output connectors of the power supply by a parallel switch incorporated inside the power supply—or simply—by closing a discharging switch for this time.

According to some embodiments, excessive energy stored in the energy storing device is eliminated by means of a discharging circuit prior to re-enabling the power supply to the load.

In some implementations, the circuit configuration may be alternatively arranged so that the switch is either arranged on a positive side of the power supply unit or on a negative side of the power supply unit.

According to further embodiments, the pre-charging circuit and the discharging circuit may be integrated in a common circuit entity. Alternatively, the pre-charging circuit and the discharging circuit may be devised as separate circuits. In particular, the discharging circuit may comprise an electrical non-linear device (e.g., a diode) and a resistive element (discharge resistor) connected in parallel.

Since both the switch and the discharge resistor will heat up considerably during operation, any one of the elements may advantageously be equipped with a heat sink structure in order to efficiently dissipate excess heat. That means, that the energy, which was—prior to the invention—dumped to the load, thereby in some cases supplying an arc with energy rather than extinguishing the arc, is now captured in the "energy storing element", for example a capacitor. This energy can be dissipated in the resistive element—therefore a heat sink for this element is advantageous, but alternatively the energy can be recycled e.g. fed back to the power supply.

Any diodes or resistors used in connection with the present invention may alternatively be devised as controlled metal oxide semiconductor field effect transistors (MOSFETs), a transistor, thyristor, or triac, as well as a varistor or an electromechanical or magnetic device with non-linear behavior.

In particular when using a circuit configuration as described herein in connection with arc extinction for plasma applications, detecting (and extinguishing) an excessive number of plasma arcs will entail heating up of the discharge resistor. In this context, a preferred embodiment of the method according to the fourth aspect of the present invention includes applying an adjustable blocking time after interrupting power supply to the plasma application. During the blocking time, the power supply is not switched on and delivery of power to the plasma application is inhibited.

In some implementations, the power supply apparatus may further comprise an antiparallel connected second circuit configuration. The power unit may either be a direct current power supply or an alternate current power supply.

An adjustable blocking time may be applied after interrupting power supply to the plasma application, to allow the energy storing device to be discharged to a pre-determined energy level.

In some embodiments, the method further comprises waiting after interrupting power supply until the energy storing device is discharged to a pre-determined energy level.

Further, the energy storing device may be discharged such that the voltage at the energy storing device is the same voltage as the voltage at the outputs of the power supply unit.

After interrupting power supply and after displacing energy a time may be allowed to pass until the power supply apparatus is ready for dissipating energy again, before closing serial switch and/or until the energy storing device is pre-charged to a predetermined energy level or a predetermined temperature is reached by a discharging circuit or the energy storing device.

Reducing electrical energy stored in one or a number of leads for connecting a direct current power supply unit with a load, in particular a plasma application, or the load, in particular stored in a lead inductance formed by a number of leads, may also be achieved by disconnecting at least one of the leads from the power supply unit, transferring the electrical energy to an energy storing device, and inhibiting with a non linear device energy flow from the energy storing device into the leads by actively pre-charging the energy storing device prior to disconnecting the lead(s) from the power supply unit.

In this way, the energy stored in the load and/or the leads may be reduced. Further, by using the non-linear device, energy flow from the energy storing device into the load may also be inhibited.

Energy in the energy storing device may be displaced, for example dissipated or fed to the power supply unit, before one of the leads is switched back to the power supply unit. In some implementations, the energy storing device may be charged such that the voltage at the energy storing device is the same voltage as the voltage at the outputs of the power supply unit.

Referring now to the figures, FIG. 1 shows is a circuit diagram of an embodiment of a power supply apparatus including a first embodiment of the circuit configuration.

Power supply apparatus 1 is connected with a plasma application 2, e.g., in the form of a plasma device or plasma chamber, by means of leads 3.1, 3.2, which are connected to respective outputs 4.1, 4.2 of power supply apparatus 1. Leads 3.1, 3.2 may be arranged in a common cable and present respective lead inductances L1, L2, thus forming a total lead inductance L=L1+L2. Lead inductance L may store electrical energy during operation of power supply apparatus 1, i.e., during operation of plasma application 2.

Output 4.1 of power supply apparatus 1 is connected with a positive pole (+) of direct current (DC) power supply unit (generator) 5 comprised in power supply apparatus 1. Likewise, output 4.2 of power supply apparatus 1 is connected with a negative pole (−) of DC power supply unit 5. An electrical non-linear device in form of a freewheeling diode D1 is coupled in reverse bias across the positive and negative poles of power supply unit 5. Between the negative pole (−) of power supply unit 5 and output 4.2 of power supply apparatus 1 there is arranged a switch SS in the form of a serial switch, a suitable design of which is known to a person skilled in the art. For instance, serial switch SS could be devised in the form of an IGBT (insulated-gate bipolar transistor or a MOSFET). This switch is a switch which can be switched on and off at a given time. In parallel with serial switch SS is arranged another electrical non-linear device in the form of a diode D2. Diode D2 is connected in series with a capacitor C, so that both diode D2 and capacitor C are arranged in parallel with serial switch SS, wherein the cathode of diode D2 faces the capacitor C. In this way, diode D2 and capacitor C effectively form a bypass for serial switch SS. Anode-side connecting node 6 of diode D1 is located between the bypass and the negative pole (−) of power supply unit 5.

As can further be gathered from FIG. 1, a pre-charging/discharging circuit 7 is coupled across terminals of capacitor C. Pre-charging/discharging circuit 7 is preferably devised as a voltage-controlled, externally powered unit. Pre-charging/discharging circuit 7 comprises a voltage source (not shown) for charging capacitor C to a pre-determined and adjustable voltage level. To this end, pre-charging/discharging circuit 7 presents positive and negative poles (+/), wherein the positive pole (+) of pre-charging/discharging circuit 7 is connected between capacitor C and the cathode of diode D2, whereas the negative pole (−) of pre-charging/discharging circuit 7 is connected between capacitor C and serial switch SS, i.e., between capacitor C and anode-side connecting node 6 of diode D1. In this way, diode D2 is arranged in reverse bias with respect to the pre-charging potential of pre-charging/discharging circuit 7 and is adapted to block a pre-charging current from the pre-charging circuit for charging capacitor C. Capacitor C could be replaced by any sort of energy storing device. For example, in implementations using an inductor as an energy storing device, the pre-charging/discharging circuit 7 is preferably devised as a current-controlled, externally powered unit.

In the embodiment of FIG. 1, power supply apparatus 1 further comprises a monitoring/control unit 8, a function of which will be explained in detail further below. However, as will be appreciated by a person skilled in the art, monitoring/control unit 8 could in principle be devised in the form of a separate entity with respect to power supply apparatus 1. Monitoring/control unit 8 is operatively connected with serial switch SS, pre-charging/discharging circuit 7, power supply unit 5, and plasma application 2. In a preferred embodiment of the present invention, monitoring/control unit 8 is devised as a plasma arc detection/extinction unit, and is adapted for monitoring an operational state of plasma application 2 for detecting occurrences of plasma arcs in order to control operation of serial switch SS and/or pre-charging/discharging circuit 7 in response to the monitoring of plasma application 2. The monitoring/control unit 8 may be adapted to detect plasma arcs directly by monitoring plasma application 2, i.e., from plasma parameters. It may alternatively or additionally be adapted to do so indirectly by monitoring operational parameters of power supply unit 5, e.g., output voltage and/or output current of power supply unit 5.

As will be appreciated by a person skilled in the art, extinction of detected plasma arcs is generally accomplished by interrupting the power supply to plasma application 2 by way of opening serial switch SS under control of monitoring/control unit 8. Further to this, the embodiment of FIG. 1 ensures lead inductance energy reduction to enable fast arc extinction in plasma applications.

Operation of power supply apparatus 1 according to FIG. 1 will now be described in detail. Under normal operating conditions, i.e., with no arcs detected in plasma application 2, serial switch SS is closed, and the pre-charging/discharging circuit 7 pre-charges capacitor C to the pre-determined voltage level. When a plasma arc is detected by monitoring/control unit 8, serial switch SS is opened under control of monitoring/control unit 8, thus forcing a current in the lead inductances L1, L2, which will generally be increased due to the occurrence of a plasma arc, to flow through diode D2 against the initial pre-charged voltage of capacitor C and then further through freewheeling diode D1 via connecting node 6. In this way, diode D2 effectively functions as a bypass diode for opened serial switch SS. Owing to this particular arrangement, a considerable amount of residual electrical energy, which is mainly stored in lead inductances L1, L2, is transferred into capacitor C and stored therein instead of being delivered to the plasma arc or plasma arc discharge. This contributes to an accelerated extinction of plasma arcs. In other words, the total energy transferred to the arc discharge is significantly reduced. Prior to re-closing serial switch SS in order to re-establish the supply of power for plasma application 2, the excess electrical energy stored in capacitor C is eliminated by means of the discharging function of pre-charging/discharging circuit 7. Then, serial switch SS may be safely closed under control of monitoring/control unit 8.

Optionally, monitoring/control unit 8 may comprise an additional function 8a, which provides an adjustable blocking time, i.e., a corresponding control signal (not shown) for controlling serial switch SS, during which a further interruption of the power supply to plasma application 2 is inhibited. In other words, when power being supplied to plasma application 2 is interrupted by opening serial switch SS under control of monitoring/control unit 8, blocking time function 8a will ensure that serial switch SS cannot be opened again during the blocking time—if it has been closed in the meantime in order to re-establish the supply of power to plasma application 2. This is to adjustably set a low arc detection rate, which may be important in order to allow pre-charging/discharging circuit to swap charges and to avoid excessive heating of serial switch SS.

During the above-described operation of power supply apparatus 1 considerable heat will be dissipated at serial switch SS. Therefore, serial switch SS may advantageously be equipped with a heat sink structure for dissipating excess heat, which is not shown in FIG. 1.

In this way, as will be appreciated by a person skilled in the art, serial switch SS, bypass diode D2, capacitor C, and pre-charging/discharging circuit 7 together with freewheeling diode D1 effectively constitute a circuit configuration 9 for reducing electrical energy stored in lead inductance L formed by leads L1, L2. The circuit configuration 9 has been highlighted by means of dashed box in FIG. 1.

The first electrical nonlinear device (Diode D2) and the energy storing device (capacitor C) are arranged in a current path between two leads 3.1, 3.2 while the power being supplied to the load (plasma application 2) is interrupted.

Both diodes D1 and D2 could be replaced by switches which may be controlled by monitoring/control unit 8. With a plurality of circuit configurations 9 which are connected antiparallel and with controllable switches instead of diodes D1, D2 this circuit arrangement consisting of at least two antiparallel circuit configurations 9 is also applicable to a system with a power supply unit 5 which feeds AC energy into the plasma application 2.

Figure 2:
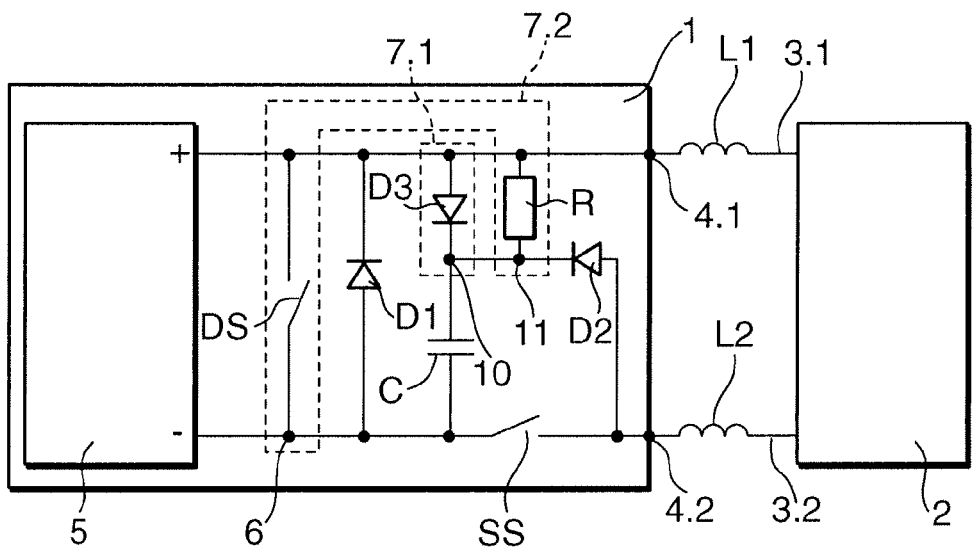
FIG. 2 is a circuit diagram of an embodiment of a power supply apparatus including a second embodiment of the circuit configuration.

FIG. 2 shows a circuit diagram of an embodiment of a power supply apparatus including a second embodiment of the circuit configuration. As will be appreciated by a person skilled in the art, power supply apparatus of FIG. 2 is generally similar to that of FIG. 1, which has been described in detail above, so that the following description will focus on differences between the embodiments of FIG. 1 and FIG. 2 only. It should also be noted that in FIG. 2 monitoring/control unit 8 has been omitted for mere reason of clarity.

Instead of integrated pre-charging/discharging circuit 7 of FIG. 1, the power supply apparatus 1 according to FIG. 2 comprises distinct pre-charging and discharging circuits 7.1, 7.2, respectively. Charging circuit 7.1 is formed by an electrical non-linear device in the form of a diode D3 connected between the positive pole (+) of power supply unit 5 and node 10, which is located between capacitor C/cathode of diode D3 and the cathode of bypass diode D2. Discharging circuit 7.2 is formed by a resistive element in the form of discharge resistor R connected between output 4.1 of power supply apparatus 1 and node 11, which is located between node 10 and the cathode of bypass diode D2. Furthermore, discharging circuit 7.2 comprises a discharge switch DS coupled across the positive and negative poles (+/−) of power supply unit 5 in parallel with freewheeling diode D1. Diodes D2 and D3 are arranged with opposite blocking directions, i.e., they are connected in cathode-to-cathode type fashion.

Operation of power supply apparatus 1 according to the embodiment of FIG. 2 is as follows. Under normal operating conditions, serial switch SS is closed. Capacitor C is charged through diode D3 (charging diode) to an output voltage level of power supply unit 5. Upon detection of an arc discharge in plasma application 2, as previously described with reference to appended FIG. 1, serial switch SS is opened, thus forcing an output current of power supply apparatus 1 to flow through bypass diode D2 against the initial voltage of capacitor C and then further through freewheeling diode D1. Again, owing to this arrangement, a large amount of the residual energy stored in lead inductance L is transferred into capacitor C instead of being delivered to the arc discharge. As a result of this, the total energy transferred to the arc discharge is significantly reduced, thus contributing to accelerated arc extinction. Excess energy stored in capacitor C is eliminated by means of discharging circuit 7.2 prior to subsequent switching-on of serial switch SS. As will be further appreciated by a person skilled in the art, operation of discharge switch DS in discharging circuit 7.2, i.e., closing switch DS in order to discharge capacitor C through discharge resistor R, could also be controlled by means of monitoring/control unit 8 (cf. FIG. 1).

Instead of using regular diodes, any one of electrical nonlinear device D1-D3 could alternatively be devised in the form of a suitably controlled MOSFET, control of which could also be provided by monitoring/control unit 8 (FIG. 1).

Figure 3:
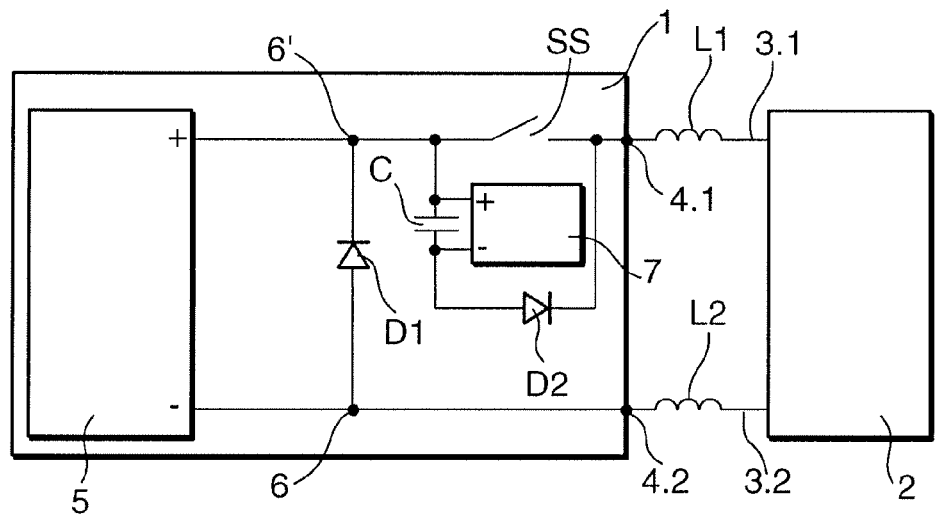
FIG. 3 is a circuit diagram of an embodiment of a power supply apparatus including a third embodiment of the circuit configuration.

FIG. 3 shows a circuit diagram of an embodiment of a power supply apparatus including a third embodiment of the circuit configuration. Again, power supply apparatus 1 of FIG. 3 generally corresponds to that of FIG. 1 so that only differences between these two embodiments will be explained here in detail. As in FIG. 2, monitoring/control unit 8 has been omitted for reason of clarity only.

In contrast to the embodiment of FIG. 1, in the embodiment of FIG. 3 serial switch SS is arranged on the positive side of power supply unit 5, i.e., is directly connected with the positive pole (+) of the latter. Consequently, configuration of the bypass path including bypass diode D2, capacitor C, and integrated pre-charging/discharging circuit 7 has been modified accordingly. It should be noted that bypass diode D2 is now connected with capacitor 10 by means of its anode instead of being connected to capacitor C via its cathode, as in FIG. 1.

Operation of power supply apparatus 1 according to FIG. 3 is similar to that of the embodiment of FIG. 1 so that a detailed description thereof can be omitted.

Figure 4:
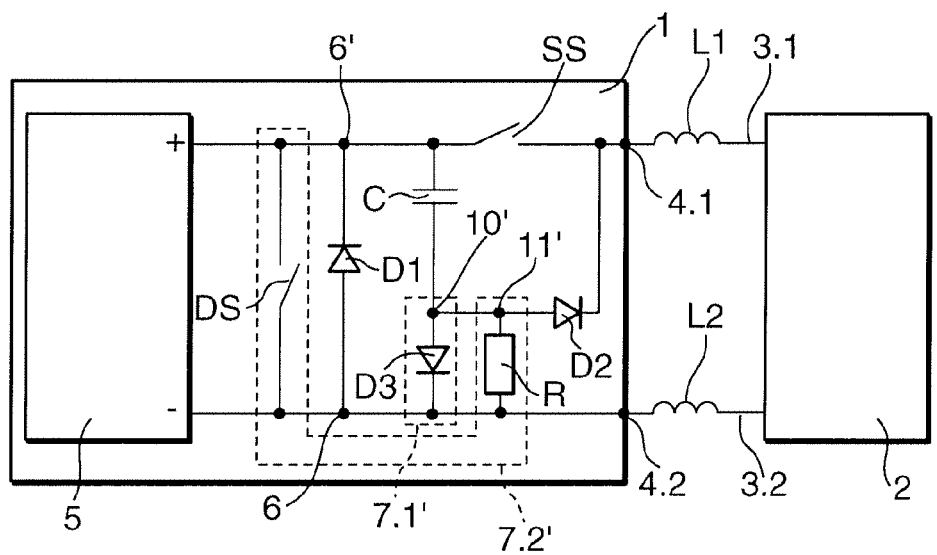
FIG. 4 is a circuit diagram of an embodiment of a power supply apparatus including a forth embodiment of the circuit configuration.

FIG. 4 shows a circuit diagram of an embodiment of a power supply apparatus including a forth embodiment of the circuit configuration. As will be appreciated by a person skilled in the art, power supply apparatus 1 according to the embodiment of FIG. 4 is a variation of the embodiment that was previously described in detail with reference to FIG. 2. As in the embodiment of FIG. 3, serial switch SS is located on the positive side (+) of power supply unit 5 in the embodiment of FIG. 4. This implies re-arranging capacitor C and bypass diode D2 with respect to the embodiment of FIG. 2, as previously described with reference to FIG. 3. Charging diode D3 is now connected between the negative pole (−) of power supply unit 5 and node 10', which is located between the anode of charging diode D3 and capacitor C. Discharge resistor R is connected in parallel with charging diode D3, so that one terminal of discharge resistor R is connected with the negative pole (−) of power supply unit 5 while the other terminal of discharge resistor R is connected with node 11' located between node 10' and the anode of bypass diode D2. Diodes D2, D3 are connected in anode-to-anode type fashion, i.e., with opposite blocking directions. While charging diode D3 of FIG. 4 effectively forms pre-charging circuit 7.1', switch DS and resistor R effectively form discharging circuit 7.2'.

Operation of power supply apparatus 1 according to FIG. 4 corresponds to that previously described with reference to appended FIG. 2. Therefore, a detailed description thereof can be omitted.

As previously described in connection with serial switch SS, discharge resistors R of FIG. 2 and FIG. 4 may dissipate a considerable amount of heat during operation of power supply apparatus 1. Therefore, discharge resistors R, too, could be advantageously equipped with heat sink structures (not shown) in order to efficiently dissipate excess heat.

Figure 5:
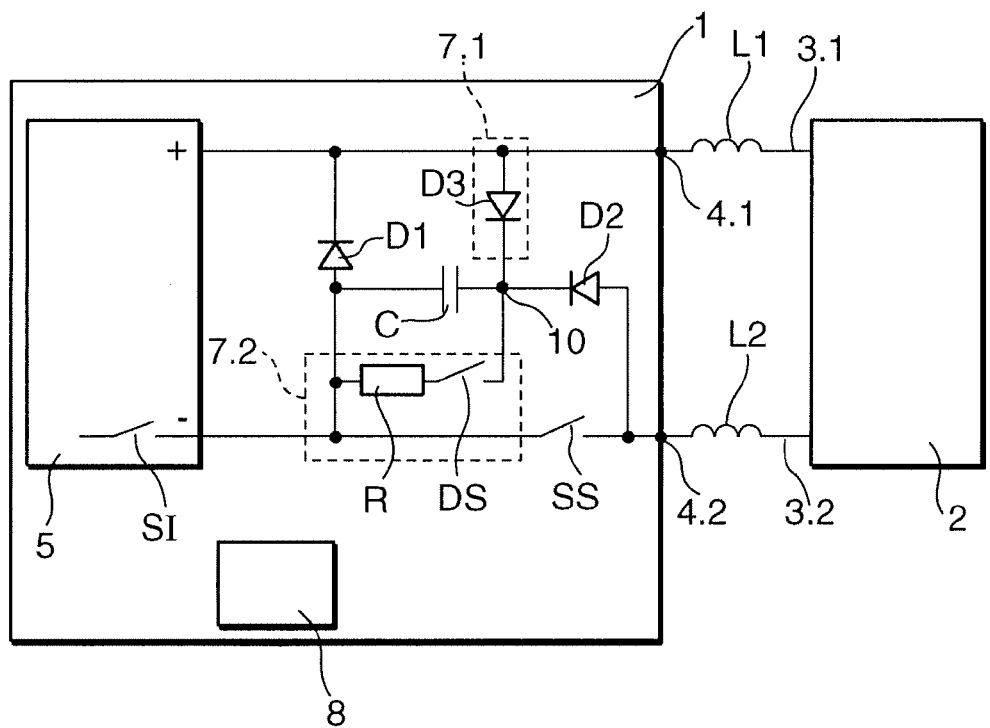
FIG. 5 is a circuit diagram of an embodiment of a power supply apparatus including a fifth embodiment of the circuit configuration.

FIG. 5 shows a circuit diagram of an embodiment of a power supply apparatus including a fifth embodiment of the circuit configuration. As will be appreciated by a person skilled in the art, power supply apparatus of FIG. 5 is generally similar to that of FIG. 2, which has been described in detail above, so that the following description will mainly focus on differences between the embodiments of FIG. 5 and FIG. 2 only.

The power supply apparatus 1 according to FIG. 5 comprises distinct pre-charging and discharging circuits 7.1, 7.2, respectively. Charging circuit 7.1 is formed by an electrical non-linear device in the form of a diode D3 connected between the positive pole (+) of power supply unit 5 and node 10, which is located between capacitor C and the cathode of diode D3 and the cathode of bypass diode D2.

Switch SS and discharge switch DS may be operated simultaneously, i.e. when output 4.2 is disconnected from power supply unit 5, switch DS may be closed at the same time such that discharge resistor R is parallel to capacitor C. Switch DS may also be switched non-simultaneously to control the displaced energy level or the pre-charge in the energy storing device (see below).

Discharging circuit 7.2 is formed by a resistive element in the form of discharge resistor R connected between cathode of diode D1 and discharge switch DS, which also is part of the discharging unit 7.2. A heat sink is provided for resistor R. Freewheeling diode D1 is connected between the capacitor C and the positive pole (+) of power supply unit 5.

Operation of power supply apparatus 1 according to the embodiment of FIG. 5 is as follows. Under normal operating conditions, serial switch SS is closed, i.e. connects the output 4.2 to the negative pole (−) of power supply unit 5. Capacitor C is charged through diode D3 (charging diode) to an output voltage level of power supply unit 5. Upon detection of an arc discharge in plasma application 2, as previously described with reference to appended FIG. 1, serial switch SS is opened, thus forcing an output current of power supply apparatus 1 to flow through bypass diode D2 against the initial voltage of capacitor C and then further through freewheeling diode D1. Additionally, a switch SI within power supply unit 5 may be opened to inhibit further power output from power supply unit 5, i.e. the power being supplied is interrupted.

Again, owing to this arrangement, a large amount of the residual energy stored in lead inductance L is transferred into capacitor C instead of being delivered to the arc discharge. As a result of this, the total energy transferred to the arc discharge is significantly reduced, thus contributing to accelerated arc extinction. Excess energy stored in capacitor C is eliminated by means of discharging circuit 7.2 prior to subsequent closing of serial switch SS to connect output 4.2 to power supply unit 5. As will be further appreciated by a person skilled in the art, operation of discharge switch DS in discharging circuit 7.2, i.e., closing switch DS in order to discharge capacitor C through discharge resistor R, could also be controlled by means of monitoring/control unit 8.

The voltage on the capacitor C cannot be lower than that of the voltage source (power supply unit 5). The capacitor C, however, is additionally charged by the current coming from the energy stored in the cables when serial switch SS is opened. Thus, the voltage on the capacitor C will be higher than that of power supply unit 5. When serial switch SS is opened, the voltage of the Capacitor C is applied to the leads, but with reversed polarity compared to power supply unit 5. Current flowing from the lead inductance L via diode D2 into the capacitor is slowed down by the pre-charged capacitor.

Energy, which returns from the cables is, in this embodiment, captured into the capacitor C. The energy transferred to the capacitor can be treated in several ways.

There is a limitation on the amount of energy, which can be stored in any capacitor. Usually it is the maximum specified voltage of that capacitor or maximum voltage allowed on the cooperating elements. The switch DS can be activated when this voltage exceeds some given threshold. This will discharge the capacitor C into e.g. the resistor R. If the voltage drops to a lower threshold, then switch DS can be opened again.

Some energy will be collected into the capacitor if a non-zero current flowing through non-zero inductance leads is switched off. Switch DS can be activated each time this happens for a time period which is enough to discharge the highest expected cable inductance energy. Afterwards, switch DS can be closed again, until discharge of capacitor C is required. Hence, switch DS can be used to control the energy stored or taken up by capacitor C and also capacitor C can be protected by suitably switching switch DS.

Instead of using regular diodes, any one of electrical non-linear device D1-D3 could alternatively be devised in the form of a suitably controlled MOSFET, or IGBT or any other switching device controlling of which could also be provided by monitoring/control unit 8.

If power supply unit 5 is a current source, switch SI can be omitted and switch DS in FIG. 2 may be used as switch SI, i.e. for interrupting the power supply unit 5 from the leads (3.1, 3.2) and load 2.

Figure 6:
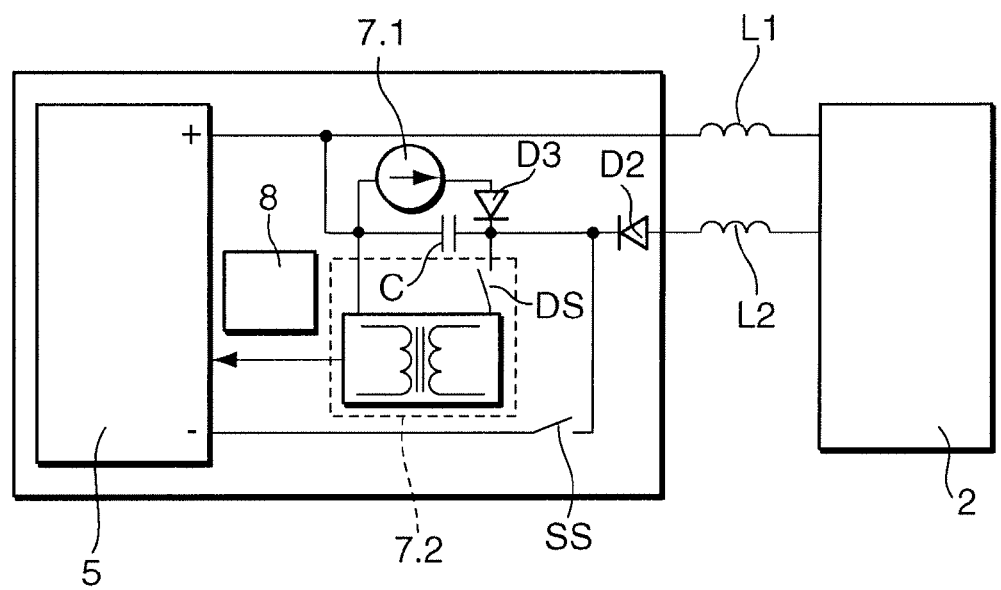
FIG. 6 is a circuit diagram of an embodiment of a power supply apparatus including a sixth embodiment of the circuit configuration.

FIG. 6 shows yet another embodiment of a power supply apparatus 1. Charging of capacitor C in this case occurs via a pre-charging circuit in the form of a voltage or current source. In contrast to previous embodiments, discharging circuit 7.2 comprises a converter, which is connected to power supply unit 5. Rather than dissipating excess energy, discharging unit 7.2 feeds excess energy into power supply unit 5 such that energy is actually "recycled".

Figure 7:
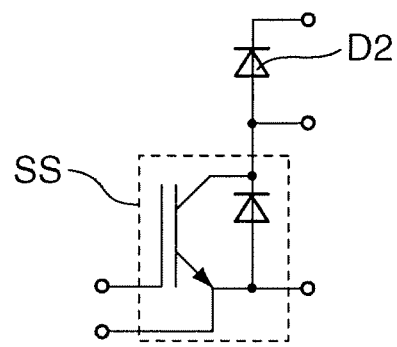
FIG. 7 shows a module including a serial switching device and a non-linear element.
Figure 8:
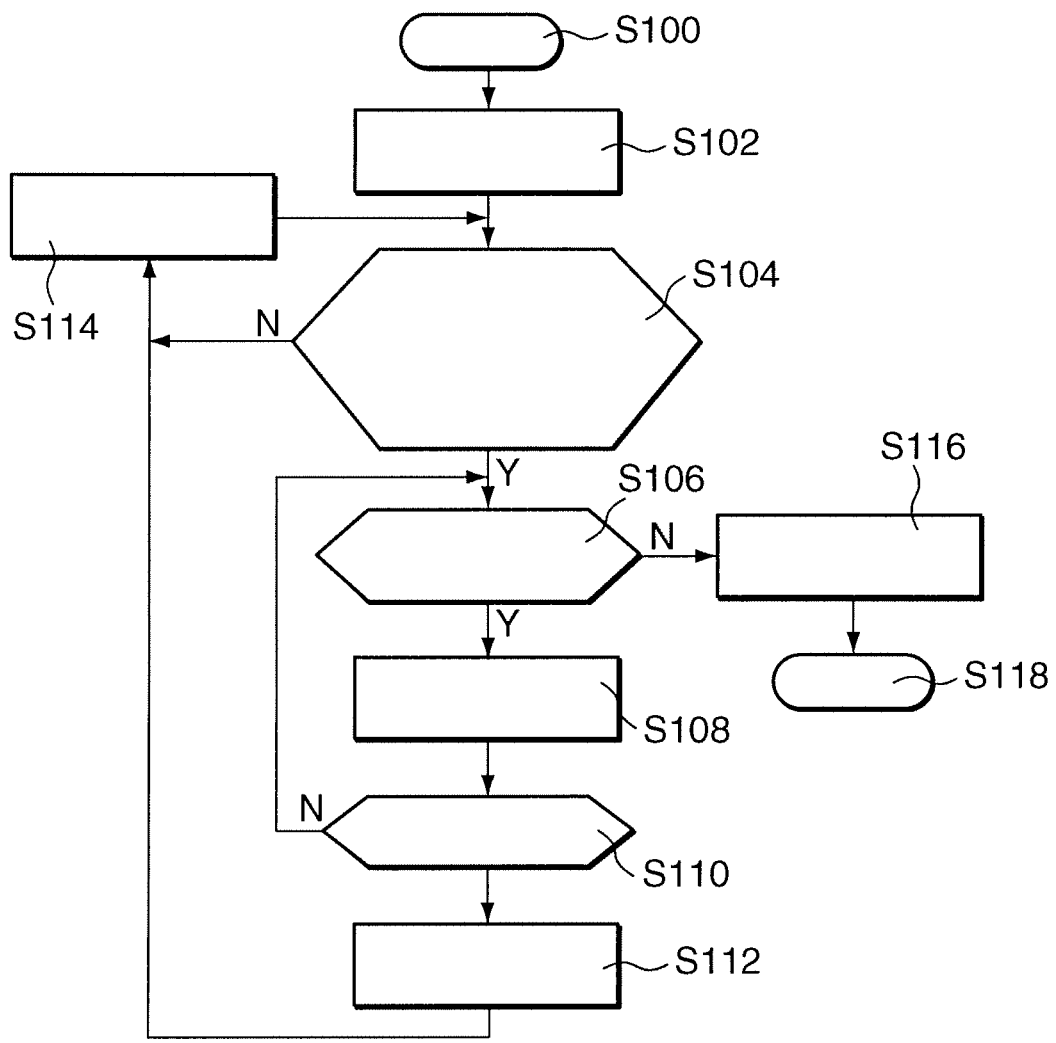
FIG. 8 is a flow chart illustrating a method for arc extinction in plasma applications, including reducing electrical energy.

As can be seen from FIG. 7, an integrated module with a switch and a serial diode can be used for the switch SS and the diode D2 such as the SKM400GB128D from SEMIKRON FIG. 8 shows a flow chart for illustrating an embodiment of a method for arc extinction in plasma applications including an embodiment of a method of reducing electrical energy. The method starts with step S100.

In subsequent step S102, the energy storing device (capacitor C) is (pre-)charged, as previously described. Then, in step S104, an operating state of the precharging/discharging circuit is checked. In particular, a check is performed to determine whether the circuit is ready for handling residual energy from the lead inductance. The circuit is ready for handling residual energy if the heat sink is not over-heated and the capacitor is not overloaded, etc.

If the precharging/discharging circuit is ready, the method proceeds to step S106 and it is checked whether power must be delivered to the plasma application, i.e. if the plasma supply unit must be switched on and serial switching device must be closed.

If the answer is yes, the method proceeds to step S108 and the serial switch is closed, the discharge switch is opened and the power supply unit is switched on, if needed.

Then, in step S110 it is determined whether an arc discharge has been detected. If the question in step S110 ("arc detected?") is answered in the affirmative (y), in subsequent step S112 serial switch is opened, the power supply unit is switched off, for example by opening the inhibiting switch and discharge switch is closed.

Subsequently, in step S114 energy is displaced which may mean dissipated or recycled. This can be done for a predetermined blocking time or until a predefined amount of energy is dissipated or recycled, or a predetermined energy level is reached. If the check in step S104 is negative, the method also goes to step S114.

If the question in step S106 is negative, i.e. answered with "no", the method proceeds to step S116 and the power supply apparatus is switched off. After that the method is stopped in step S118.

A number of embodiments of the invention have been described. Nevertheless, it will be understood that various modifications may be made without departing from the spirit and scope of the invention. Accordingly, other embodiments are within the scope of the following claims.

What is claimed is:

1. Plasma process power circuitry configured to transfer electrical energy stored in a load or in one or more leads for connecting a power supply unit with the load, the circuitry comprising:
   a first electrical nonlinear device connected in series with an energy storing device, wherein the first electrical nonlinear device and the energy storing device are configured to transfer energy from the leads or the load into the energy storing device and to prevent an energy transfer from the energy storing device into the leads or the load;
   a switch in operative connection with at least one of the leads for enabling/interrupting power from the power supply unit to the load, the switch being connected in parallel with the series connection of the first electrical nonlinear device and the energy storing device;
   a pre-charging circuit in operative connection with the energy storing device, the pre-charging circuit configured to charge the energy storing device to a pre-determined energy level while power to the load from the power supply unit is enabled and to maintain the pre-determined energy level on the energy storing device while the plasma process power circuitry is not detecting a plasma arc; and
   a control unit coupled to the switch and configured to detect a plasma arc and toggle the switch connected in parallel with the series connection of the first electrical nonlinear device and the energy storing device to interrupt power from the power supply unit to the load in response to detecting the arc, thereby transferring residual energy from the load or the leads into the energy storing device against the pre-determined energy level of the energy storing device.

2. The circuitry of claim 1, further comprising a control/monitoring unit configured to interrupt power being supplied thru the leads prior to the energy transfer from the leads or the load into the energy storing device.

3. The circuitry of claim 1, wherein the first electrical nonlinear device is an electrical valve.

4. The circuitry of claim 1, wherein the energy storing device is a capacitance and/or an inductance.

5. The circuitry of claim 1, wherein the first electrical non-linear device is configured to prevent a current originating from the pre-charging circuit and/or the energy storing device from being delivered into the leads.

6. The circuitry of claim 1, wherein the first electrical nonlinear device and the energy storing device are arranged in a current path between two leads while power to the load is interrupted.

7. A method of reducing electrical energy stored in a load or in one or more leads for connecting a plasma process power supply with the load, the method comprising:
   pre-charging an energy storage device connected in series with a first electrical nonlinear device to a pre-determined energy level, wherein the first electrical nonlinear device and the energy storing device are configured to transfer energy from the leads or the load into the energy storing device and to prevent an energy transfer from the energy storing device into the leads or the load;
   maintaining the predetermined energy level on the energy storage device while power to the load from a power supply unit is enabled and while the plasma process power circuitry is not detecting a plasma arc; and
   detecting a plasma arc and, in response, disconnecting at least one of the leads from the power supply by opening a switch connected in parallel with the series connection of the first electrical nonlinear device and the energy storing device, thereby transferring residual energy from the load or the leads into the energy storing device against the pre-determined energy level of the energy storing device.

* * * * *